(12) United States Patent
Bassoli et al.

(10) Patent No.: US 9,048,794 B2
(45) Date of Patent: Jun. 2, 2015

(54) METHOD AND APPARATUS FOR EFFICIENT AND DISTORTION COMPENSATED DIGITAL CLASS-D AMPLIFIER TERNARY MODULATION SCHEME

(75) Inventors: Rossella Bassoli, Monza (IT); Carlo Crippa, Merate (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 134 days.

(21) Appl. No.: 13/881,279

(22) PCT Filed: Oct. 18, 2011

(86) PCT No.: PCT/EP2011/005236

§ 371 (c)(1),
(2), (4) Date: Apr. 24, 2013

(87) PCT Pub. No.: WO2012/055501

PCT Pub. Date: May 3, 2012

(65) Prior Publication Data

US 2013/0222063 A1  Aug. 29, 2013

Related U.S. Application Data

(60) Provisional application No. 61/441,094, filed on Feb. 9, 2011.

(30) Foreign Application Priority Data

Oct. 27, 2010  (EP) .................................... 10014040

(51) Int. Cl.
*H03F 3/217* (2006.01)
*H03F 1/32* (2006.01)
*H03F 1/26* (2006.01)
*H03K 7/08* (2006.01)

(52) U.S. Cl.
CPC ................ *H03F 1/3205* (2013.01); *H03F 1/26* (2013.01); *H03F 3/217* (2013.01); *H03F 3/2173* (2013.01); *H03F 2200/03* (2013.01); *H03F 2200/351* (2013.01); *H03K 7/08* (2013.01); *H03F 3/2171* (2013.01)

(58) Field of Classification Search
CPC ......... H03F 1/32; H03F 3/217; H03F 3/2173; H03F 1/3217; H03F 2200/336; H03F 3/3076; H03F 3/38; H03F 1/0222; H03F 1/0272; H03F 1/3205; H03F 2200/345; H03F 2200/351; H03F 2203/21142; H03F 3/2171
USPC ........................................ 330/10, 207 A, 251
See application file for complete search history.

(56) References Cited

U.S. PATENT DOCUMENTS

| 5,617,058 A | 4/1997 | Adrian et al. |
| 6,538,504 B1 | 3/2003 | Kirn |
| 6,614,297 B2 | 9/2003 | Score et al. |

(Continued)

*Primary Examiner* — Khanh V Nguyen
(74) *Attorney, Agent, or Firm* — Coats & Bennett, PLLC

(57) ABSTRACT

The present disclosure generally relates to the field of digital Class-D amplifiers and more specifically to a technique for reducing output waveforms distortion of a digital class-D amplifier implementing a ternary modulation scheme. An apparatus embodiment comprises an enlarging component for enlarging at least one pulse of a first output waveform PWM_P_TERN' of the amplifier 50 by a first enlarging pulse, wherein the at least one pulse of the first output waveform PWM_P_TERN' is symmetrically enlarged by the first enlarging pulse with respect to the center position of the at least one pulse; and a pulses generating component for generating at least one first compensating pulse comp_pulse_p and for adding the generated at least one first compensating pulse comp_pulse_p on a second output waveform PWM_N_TERN' of the amplifier 50, wherein the at least one first compensating pulse comp_pulse_p has substantially the same width P as the first enlarging pulse and is added on the second output waveform PWM_N_TERN' at a position which corresponds to the center position of the at least one pulse of the first output waveform PWM_P_TERN'.

13 Claims, 10 Drawing Sheets

(56) References Cited

U.S. PATENT DOCUMENTS

| | | | |
|---|---|---|---|
| 7,737,776 B1* | 6/2010 | Cyrusian | 330/10 |
| 2010/0102883 A1* | 4/2010 | Stapelbroek | 330/251 |
| 2010/0315163 A1* | 12/2010 | Takagi et al. | 330/207 A |
| 2011/0064245 A1* | 3/2011 | Kim et al. | 330/207 A |

\* cited by examiner

METHOD AND APPARATUS FOR EFFICIENT AND DISTORTION COMPENSATED DIGITAL CLASS-D AMPLIFIER TERNARY MODULATION SCHEME

TECHNICAL FIELD

The invention generally relates to the field of digital Class-D amplifiers. More specifically, the invention relates to a technique for reducing output waveforms distortion of a digital class-D amplifier implementing a ternary modulation scheme.

BACKGROUND

Classical linear amplifiers, like Class-A, Class-B or Class-AB amplifiers, are known to be quite inefficient. Class-D amplifiers have power-efficiency advantages over these linear amplifier classes. In linear amplifiers such as Class-AB amplifiers significant amounts of power are lost due to biasing elements and the linear operation of the output transistors. Because the transistors of a Class-D amplifier are simply used as switches to steer current through the load, minimal power is lost due to the output stage. Most power lost in an amplifier is dissipated as heat. Because heat sink requirements can be greatly reduced or eliminated in Class-D amplifiers, they are ideal for compact high-power applications and become increasingly important.

While there are a variety of modulator topologies used in modern Class-D amplifiers, the most basic topology utilizes pulse-width modulation (PWM) with a triangle-wave (or sawtooth) oscillator signal. A simplified PWM-based, half-bridge Class-D amplifier consists of a pulse-width modulator, two output metal oxide semiconductor field-effect transistors (MOSFETs), and an external lowpass filter to recover the amplified signal, like an amplified audio signal. The two MOSFETS, e.g. one p-channel and one n-channel MOSFET, operate as current-steering switches by alternately connecting the output node to a supply voltage and ground. In order to extract the amplified (audio) signal from this PWM waveform, the output of the Class-D amplifier is fed to a lowpass filter. Because the output transistors switch the output to either the supply voltage or ground, the resulting output of a Class-D amplifier is a high-frequency square wave. The switching frequency for most Class-D amplifiers is typically between 250 kHz to 1.5 MHz.

In Class-D amplifiers, the switches are either fully on or fully off, significantly reducing the power losses in the output devices. Efficiencies of 90-95% are possible.

The input signal, e.g. an audio input signal, is used to modulate a PWM carrier signal which drives the output devices, with the last stage being the lowpass filter to remove the high frequency PWM carrier frequency.

The output square wave is pulse-width modulated by the input, e.g. the audio input signal. PWM is accomplished by comparing the (audio) input signal to an internally generated triangle-wave (or sawtooth) oscillator signal. The resulting duty cycle of the square wave is proportional to the level of the input signal. When no input signal is present, the duty cycle of the output waveform is equal to 50%. In other words, the (audio) input signal can be represented by a square wave with only two possible levels ("high" and "low"). The PWM square wave has a fixed frequency, but the time it is in the "high" and "low" states is not always 50%. It rather varies following the incoming signal. In this way, when the input signal increases, the "high" state will be present for longer than the "low" state, i.e. the value of the duty cycle increases (to is become larger than 50%). When the input signal decreases, the "low" state will be present for longer than the "high" state, i.e. the value of the duty cycle decreases (to become lower than 50%). From these values of the duty cycles, the input signal can be restored.

That is, a digital Class-D amplifier is a circuit based on a PWM technique which translates the amplitude of a given input sample into a duty cycle of a high frequency reference signal. This high frequency signal directly drives the output buffer that, in the simplest possible implementation, could be a pure inverter. Class-D amplifiers take on many different forms, some can have digital inputs and some can have analog inputs.

FIG. 1a shows a simplified block diagram of a digital Class-D amplifier 10 with differential outputs PWM modulation, that is commonly used in the industry, where the input signal INPUT is compared with a triangular reference waveform. For this purpose, the input signal is compared with positive cycles of the reference signal REFERENCE_P and with negative cycles of the reference signal REFERENCE_N. The modulation scheme shown in FIG. 1a is called "quaternary modulation", since all four digital states combinations "00", "01", "10", "11" could appear at the outputs at each time instant, i.e. the output signals PWM_P and PWM_N can both be "high" (state "11"), both be "low" (state "00") or one can be "high" and the other can be "low" (states "10" or "01"). The resulting difference signal PWM_DIFF resulting from the output signals PWM_P and PWM_N is also given in FIG. 1a.

FIG. 1b illustrates a resulting PWM output waveform when an analog audio signal is compared with a triangular reference waveform. As can be seen from FIG. 1b, the output waveform is pulse-width modulated due to the varying input-signal level.

Another kind of modulation, named "ternary modulation", can be obtained by applying some logic equations to the quaternary outputs. More precisely, the ternary signals can be obtained by using the following equations:

$$PWM\_P\_TERN = (PWM\_P\_QUAT \text{ and not } PWM\_N\_QUAT) \quad (1)$$

$$PWM\_N\_TERN = (PWM\_N\_QUAT \text{ and not } PWM\_P\_QUAT) \quad (2)$$

In ternary modulation, only three states can appear at the two outputs, i.e. "00", "01" and "10", i.e. the ternary output signals PWM_P_TERN and PWM_N_TERN can not be "high" at the same time. FIG. 2 shows these waveforms. The waveform named PWM_DIFF represents the differential behaviour of the Class-D outputs in case of ternary modulation.

It can be noticed that during positive cycles of the input waveforms only PWM_P_TERN is active, i.e. different from zero, while during negative cycles only PWM_N_TERN is active.

Ternary modulation is usually preferred to quaternary one because of the much lower "common mode" Electromagnetic Interference (EMI) pollution.

One problem typical of the ternary modulation is the so called "minimum pulse width", shown in the difference waveform PWM_DIFF in FIG. 2, which happens for input signal levels approaching zero, due to rise and fall times of the output waveforms. This behavior is responsible for a significant non-linearity error since the small signals effective pulse amplitude is corrupted by the non-ideal rising and falling edges.

A ternary modulation scheme is weaker than a quaternary one regarding the mismatch on rising and/or falling times of one single ended output versus the other. In other words, a pure ternary scheme shows rather high harmonics distortion values whenever the rising (falling) time of the PWM_P waveform is different from the rising (falling) time of the PWM_N waveform. Edges mismatch between the two outputs PWM_P and PWM_N can arise for various reasons, such as different internal signal path lengths, different output loads, different signal paths on the board etc. Various techniques have been developed to compensate those non-idealities. For instance, U.S. Pat. No. 6,614,297 and U.S. Pat. No. 5,617,058 describe two different ways to cope with this problem. However, the mechanisms described in U.S. Pat. No. 6,614,297 and U.S. Pat. No. 5,617,058 do not solve this problem.

The mechanism described in U.S. Pat. No. 6,614,297, shown in FIG. 3a, generates a minimum pulse by shifting one of the two outputs and then applying the ternary logic equations (1) and (2) as set forth above. For low levels near zero extra pulses are generated, while as soon as the signal increases such pulses decrease in width, till they disappear. In this way the ternary modulation problem for very low levels is simply translated from the zero input level range to a level which depends on the amount of shift implemented.

The mechanism described in U.S. Pat. No. 5,617,058, shown in FIG. 3b, tries to face the minimum pulse distortion by adding compensating pulses for low level signals, meantime enlarging the signal pulse by the same width as the compensating pulse. The mechanism described in U.S. Pat. No. 5,617,058 doubles non symmetrical shift and increases the distortion due to the non-symmetric relative shift of the positive and negative cycles.

SUMMARY

Accordingly, there is a need to provide an improved technique for reducing output waveforms distortion of a digital Class-D amplifier implementing a ternary modulation scheme.

This need is satisfied, according to a first aspect, by a method for reducing output waveforms distortion of a digital Class-D amplifier implementing a ternary modulation scheme. The method comprises the steps of enlarging at least one pulse of a first output waveform of the amplifier by a first enlarging pulse, wherein the at least one pulse of the first output waveform is symmetrically enlarged by the first enlarging pulse with respect to the centre position of the at least one pulse; and adding at least one first compensating pulse on a second output waveform of the amplifier to compensate the enlargement of the at least one pulse of the first output waveform, wherein the at least one first compensating pulse has substantially the same width as the first enlarging pulse and is added on the second output waveform at a position which corresponds to the centre position of the at least one pulse of the first output waveform.

The position at which the at least one first compensating pulse is added on the second output waveform is not arbitrary. The at least one first compensating pulse is added (on the second output waveform) such that it as exactly as possible lies in the middle of the at least one pulse of the first output waveform. For example, the at least one first compensating pulse is added (on the second output waveform) at a position which exactly corresponds to the centre position of the at least one pulse of the first output waveform. In case each of the first and the second output waveforms contains more than one pulse, for each of the pulses of the first output waveform which is enlarged by means of the first enlarging pulse, a corresponding first compensating pulse may be added on the second output waveform at the respective middle position of the corresponding pulse of the first output waveform. In accordance with the first aspect, the at least one first compensating pulse serves to compensate the enlargement of the at least one pulse of the first output waveform.

The first output waveform may be obtained by comparing an input signal to positive cycles of a reference signal and the second output waveform may be obtained by comparing the input signal to negative cycles of the reference signal. The reference signal may be a triangle-wave (sawtooth) as shown in FIG. 1a. In this way, the positive cycle may correspond to the signal REFERENCE_P and the negative cycle may correspond to the signal REFERENCE_N shown in FIG. 1a.

Independent of how the amplifier is constituted and of how the reference signal is formed, the method may further comprise, according to a first variant of the first aspect, the steps of enlarging at least one pulse of the second output waveform by a second enlarging pulse, wherein the at least one pulse of the second output waveform is symmetrically enlarged by the second enlarging pulse with respect to the centre position of the at least one pulse; and adding at least one second compensating pulse on the first output waveform to compensate the enlargement of the at least one pulse of the second output waveform, wherein the at least one second compensating pulse has substantially the same width as the enlarging pulse and is added on the first output waveform at a position which corresponds to the centre position of the at least one pulse of the second output waveform.

The position at which the least one second compensating pulse is added on the first output waveform is not arbitrary. The at least one second compensating pulse is added (on the first output waveform) such that it as exactly as possible lies in the middle of the at least one pulse of the second output waveform. For example, the at least one second compensating pulse is added (on the first output waveform) at a position which exactly corresponds to the centre position of the at least one pulse of the second output waveform. In case each of the first and the second output waveforms contains more than one pulse, for each of the pulses of the second output waveform which is enlarged by means of the second enlarging pulse, a corresponding second compensating pulse may be added on the first output waveform at the respective middle position of the corresponding pulse of the second output waveform. In accordance therewith, the at least one second compensating pulse serves to compensate the enlargement of the at least one pulse of the second output waveform.

An identical pulse may be used as the first enlarging pulse and the at least one first compensating pulse. Likewise, the second enlarging pulse may be identical to the at least one second compensating pulse. It is also conceivable that the first enlarging pulse, the second enlarging pulse, the first compensating pulse and the second compensating pulse may be identical to each other. Each of the first (or second) compensating pulses may have the same width or a different width, dependent on the amount the corresponding pulse on the first (or second) output waveform is enlarged.

The first output waveform may have a first plurality of pulses. In this case, each of the first plurality of pulses may be enlarged by a first enlarging pulse, which may then result in a first plurality of enlarged pulses each of which being enlarged by the first enlarging pulse. For compensating the enlargement of the first plurality of enlarged pulses, the number of first compensating pulses added to the second output waveform may be equal to the number of the first plurality of pulses (and the number of the first plurality of enlarged pulses). Each of the first plurality of pulses may be enlarged by a different amount. Dependent thereon different compensating pulses may be added to compensate the different amount.

According to the first variant of the first aspect, the second output waveform may have a second plurality of pulses. In this case, each of the second plurality of pulses may be enlarged by a second enlarging pulse, which may then result in a second plurality of enlarged pulses each of which being enlarged by the second enlarging pulse. For compensating the enlargement of the second plurality of enlarged pulses, the number of second compensating pulses added to the first output waveform may be equal to the number of the second plurality of pulses (and the number of the second plurality of enlarged pulses). Each of the second plurality of pulses may be enlarged by a different amount. Dependent thereon different compensating pulses may be added to compensate the different amount As set forth above, the at least one pulse of the first output waveform is symmetrically enlarged. To symmetrically enlarge the at least one pulse of the first output waveform, one half of the first enlarging pulse may be added to the rising edge of the at least one pulse of the first output waveform and another half of the first enlarging pulse may be added to the falling edge of the at least one pulse of the first output waveform. Other implementations for enlarging the at least one pulse of the first output waveform by means of the first enlarging pulse may be conceivable. For example, the whole first enlarging pulse may be added to the rising edge of the at least one pulse of the first output waveform and the resulting at least one enlarged pulse of the first output waveform may be shifted by a shifting amount to the right, the shifting amount corresponding to one half of the first enlarging pulse. Likewise, the whole first enlarging pulse may be added to the falling edge of the at least one pulse of the first output waveform and the resulting at least one enlarged pulse of the first output waveform may be shifted to the left by the shifting amount.

In accordance with the first variant of the first aspect, the at least one pulse of the second output waveform is symmetrically enlarged. To symmetrically enlarge the at least one pulse of the second output waveform, one half of the second enlarging pulse may be added to the rising edge of the at least one pulse of the second output waveform and another half of the second enlarging pulse may be added to the falling edge of the at least one pulse of the second output waveform. Other implementations for enlarging the at least one pulse of the second output waveform by means of the second enlarging pulse may be conceivable. For example, the total second enlarging pulse may be added to the rising edge of the at least one pulse of the second output waveform and the resulting at least one enlarged pulse of the second output waveform may be shifted by a shifting amount to the right, the shifting amount corresponding to one half of the second enlarging pulse. Likewise, the total second enlarging pulse may be added to the falling edge of the at least one pulse of the second output waveform and the resulting at least one enlarged pulse of the second output waveform may be shifted to the left by the shifting amount.

The width of the at least one second compensating pulse may be equal to the width of the at least one first compensating pulse. Both of the at least one first compensating pulse and the at least one second compensating pulse may be a small level square-wave.

According to a second variant of the first aspect, which may or may not be combined with the first variant, the method may further comprise the steps of enlarging the relative difference between computed values of duty cycles for the first and second output waveforms by a programmable width to generate enlarged values of duty cycles for the first and second output waveforms; and enlarging the at least one pulse of at least one of the first output waveform and the second output waveform based on the enlarged values of duty cycles for the first and second output waveforms. For instance, the programmable width may be a fixed value stored in the digital amplifier or may be a predetermined but adjustable value, which may be varied dependent on the input and/or output signals of the amplifier. Based on the enlarged values of duty cycles of the first and second output waveforms the at least one pulse of both the first and second output waveform may be enlarged to generate at least one enlarged pulse of the first output waveform and at least one enlarged pulse of the second output waveform.

The above need is also satisfied, according to a second aspect, by a digital class-D amplifier implementing a ternary modulation scheme for reducing output waveforms distortion of the amplifier, comprising an enlarging component for enlarging at least one pulse of a first output waveform of the amplifier by a first enlarging pulse, wherein the at least one pulse of the first output waveform is symmetrically enlarged by the first enlarging pulse with respect to the centre position of the at least one pulse; and a pulses generating component for generating at least one first compensating pulse and for adding the generated at least one first compensating pulse on a second output waveform of the amplifier, wherein the at least one first compensating pulse has substantially the same width as the first enlarging pulse and is added on the second output waveform at a position which corresponds to the centre position of the at least one pulse of the first output waveform.

The enlarging component may be further adapted to enlarge at least one pulse of the second output waveform of the amplifier by a second enlarging pulse, wherein the at least one pulse of the second output waveform is symmetrically enlarged by the second enlarging pulse with respect to the centre position of the at least one pulse. The pulses generating component may be further adapted to generate at least one second compensating pulse and to add the generated at least one second compensating pulse on the first output waveform of the amplifier, wherein the at least one second compensating pulse has substantially the same width as the second enlarging pulse and is added on the first waveform at a position which corresponds to the centre position of the at least one pulse of the second output waveform.

The amplifier may further comprise a duty-cycles computation component for computing values of duty cycles for the first and second output waveforms; and a duty-cycles enlarging component, which is coupled to the output of the duty-cycles computation component to receive the computed values of duty cycles for the first and second output waveforms, wherein the duty-cycles enlarging component is adapted to enlarge the relative difference between the computed values of duty cycles for the first and second output waveforms by a programmable width to generate enlarged values of duty cycles for the first and second output waveforms. The enlarging component may comprise the duty-cycles enlarging component or may comprise both the duty-cycles computation component and the duty-cycles enlarging component.

The amplifier may further comprise a counter and logic component, which is coupled to the output of the duty-cycles enlarging component to receive the enlarged values of duty cycles for the first and second output waveforms from the duty-cycles enlarging component and which is adapted to enlarge the at least one pulse of at least one of the first output waveform and the output second waveform based on the enlarged values of duty cycles for the first and second output waveforms. The counter and logic component may be adapted to enlarge the at least one pulse of the first output waveform based on the enlarged values of duty cycles for the first output waveform and may be adapted to enlarge the at least one pulse of the second output waveform based on the enlarged values of duty cycles for the second output waveform. The enlarging component may comprise the counter and logic component.

The amplifier may further comprise a compensating pulses generating component coupled to the output of the duty-cycles enlarging component to receive the enlarged values of duty cycles for the first and second output waveforms, wherein the compensating pulses generating component is adapted to generate, based on the received enlarged values of duty cycles for the first and second output waveforms, the at least one first compensating pulse and the at least one second compensating pulse, to add the generated at least one first compensating pulse on the second waveform at the position which corresponds to the centre position of the at least one pulse of the first output waveform and to add the generated at least one second compensating pulse on the first waveform at the position which corresponds to the centre position of the at least one pulse of the second output waveform.

BRIEF DESCRIPTION OF THE DRAWINGS

In the following, the invention will further be described with reference to exemplary embodiments illustrated in the figures, in which:

FIG. 2 is a schematic illustration of quaternary output waveforms, ternary output waveforms and the differential output waveform of the Class-D amplifier of FIG. 1a;

DETAILED DESCRIPTION

In the following description, for purposes of explanation and not limitation, specific details are set forth, such as specific circuitries including particular components, elements etc., in order to provide a thorough understanding of the present invention. It will be apparent to one skilled in the art that the present invention may be practiced in other embodiments that depart from these specific details. For example, the skilled person will appreciate that the present invention, although explained below with respect to a specific realization of a Class-D amplifier, may make use of other realizations which achieve the same advantages as the present invention.

Those skilled in the art will further appreciate that functions explained hereinbelow may be implemented using individual hardware circuitry and/or using an application specific integrated circuit (ASIC). The ASIC may be built from Field-programmable gate arrays (FPGAs), programmable logic devices (PLDs), like complex programmable logic devices (CPLDs), or any other standard parts known to those skilled in the art. It will also be appreciated that when the present invention is described as a method, this method may also be embodied on the ASIC.

The various illustrative logical blocks, modules, and circuits described in connection with the disclosure herein may not only be implemented in the ASIC, but alternatively or in combination be implemented or performed with a general-purpose processor, a digital signal processor (DSP), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor may read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 1A:
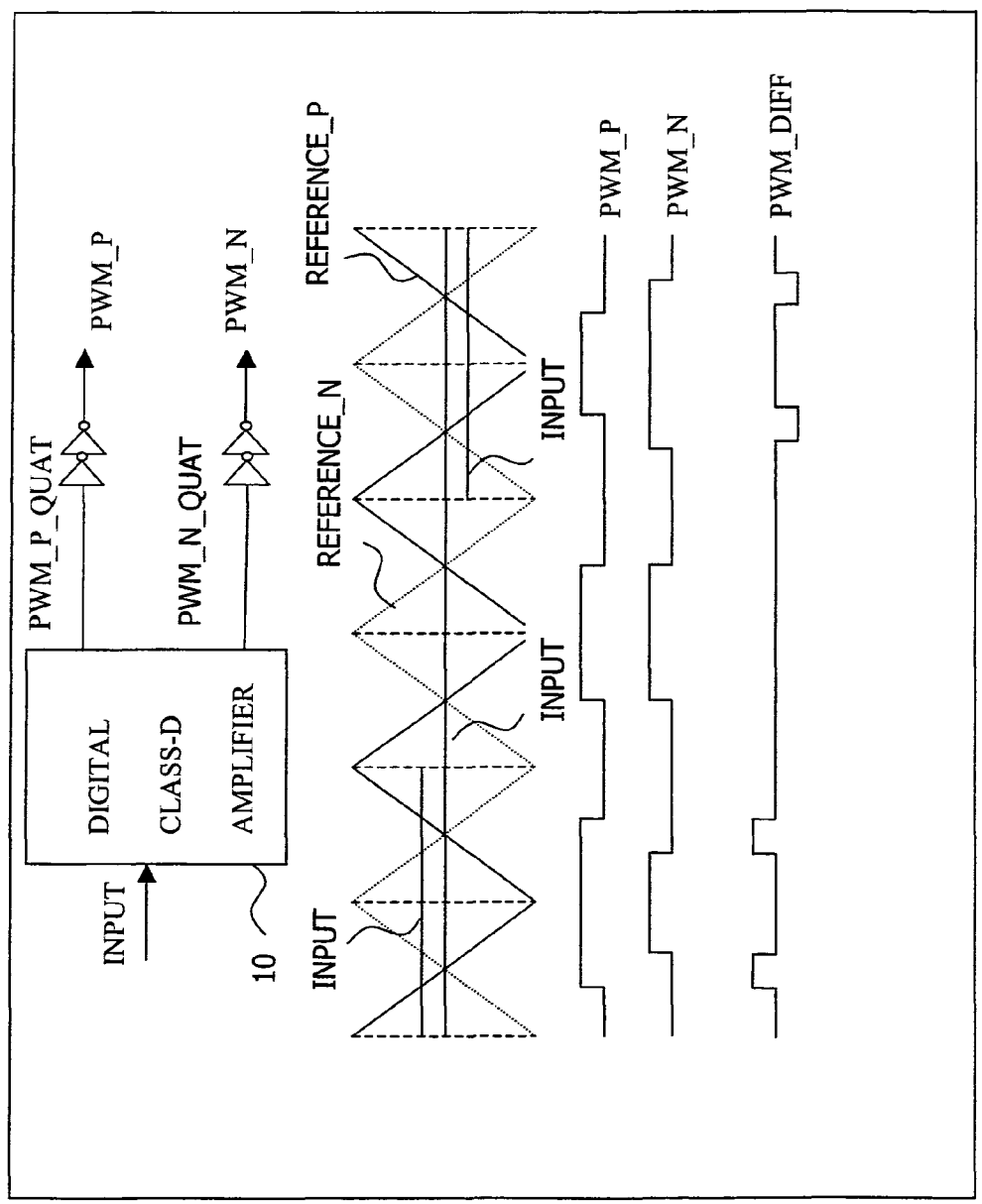
FIG. 1a is a schematic illustration of a simplified block diagram of a Class-D amplifier according to the prior art, and the generation of quaternary output waveforms of the Class-D amplifier.
Figure 1B:
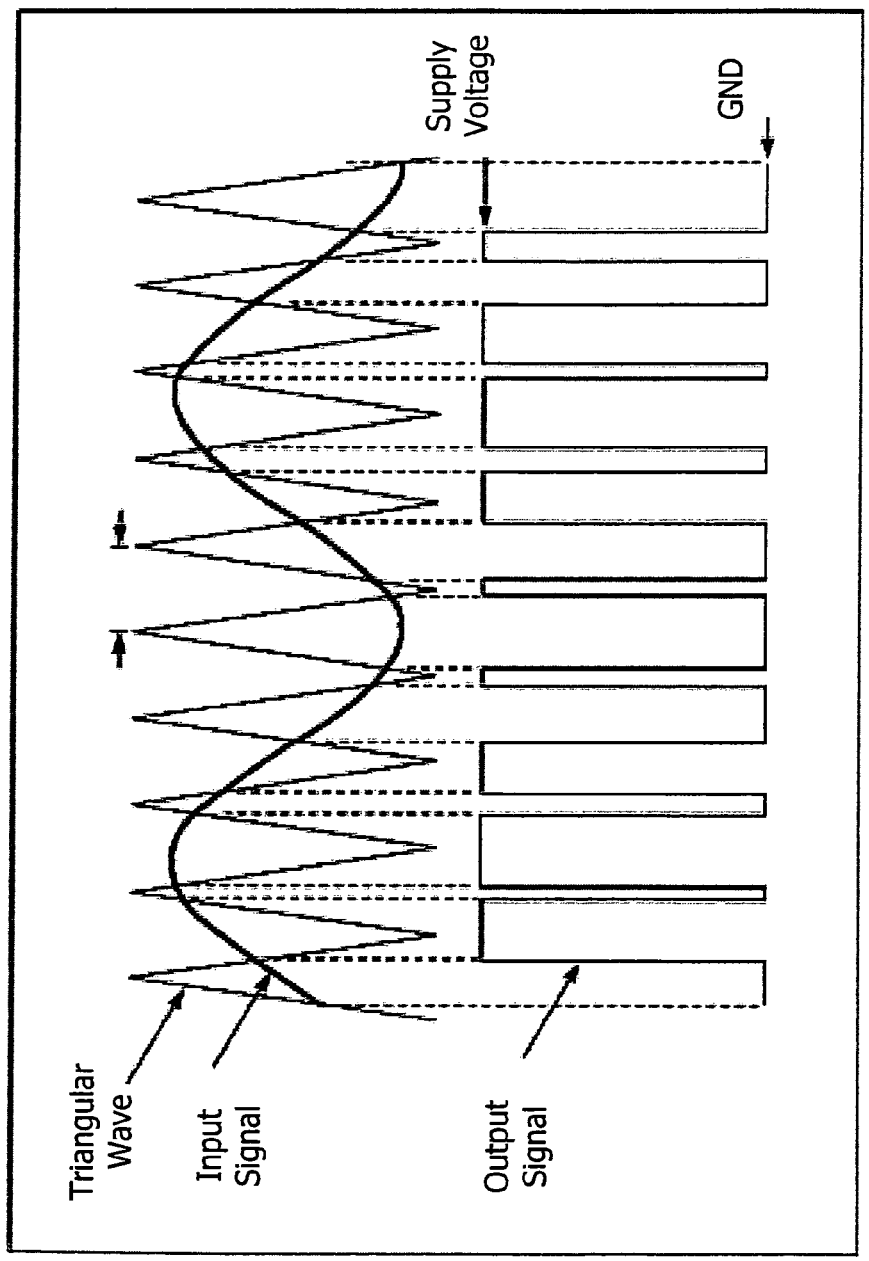
FIG. 1b is a schematic illustration of an output waveform of the Class-D amplifier of FIG. 1a, when an analog signal is input.
Figure 2:
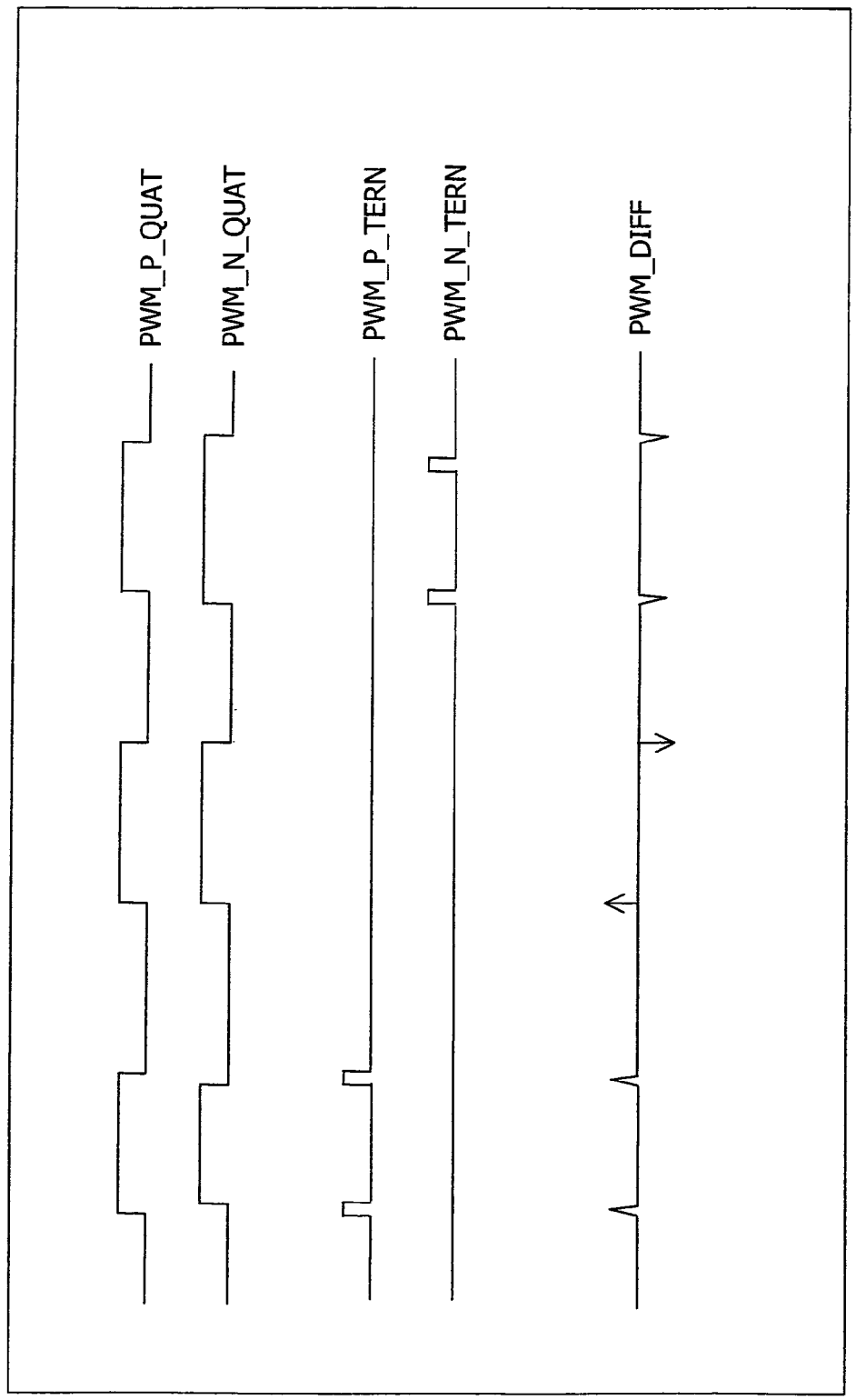
Figure 3A:
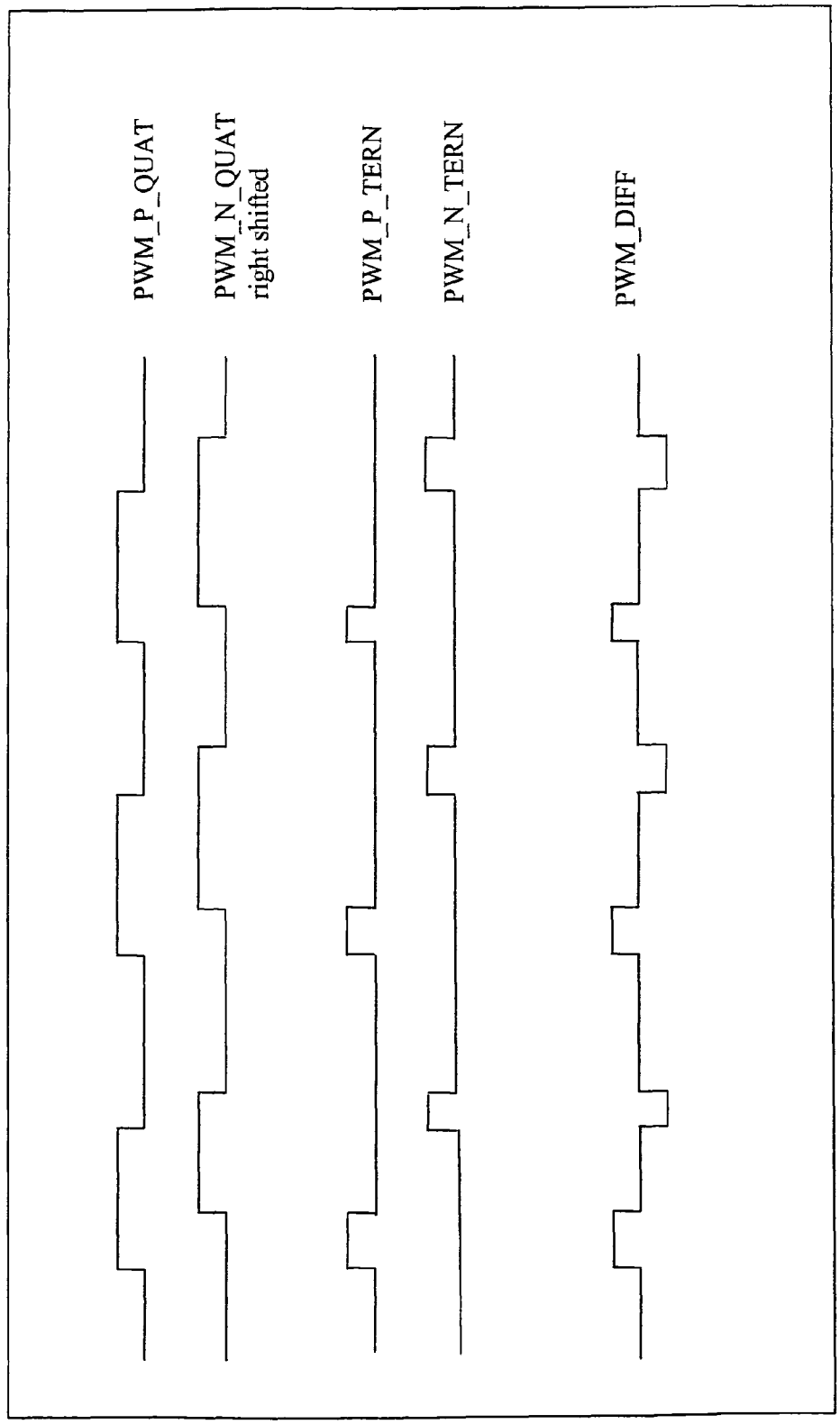
FIG. 3a is a schematic illustration of quaternary output waveforms, ternary output waveforms and the differential output waveform of the Class-D amplifier of FIG. 1a when a first compensating method according to the prior art is used.
Figure 3B:
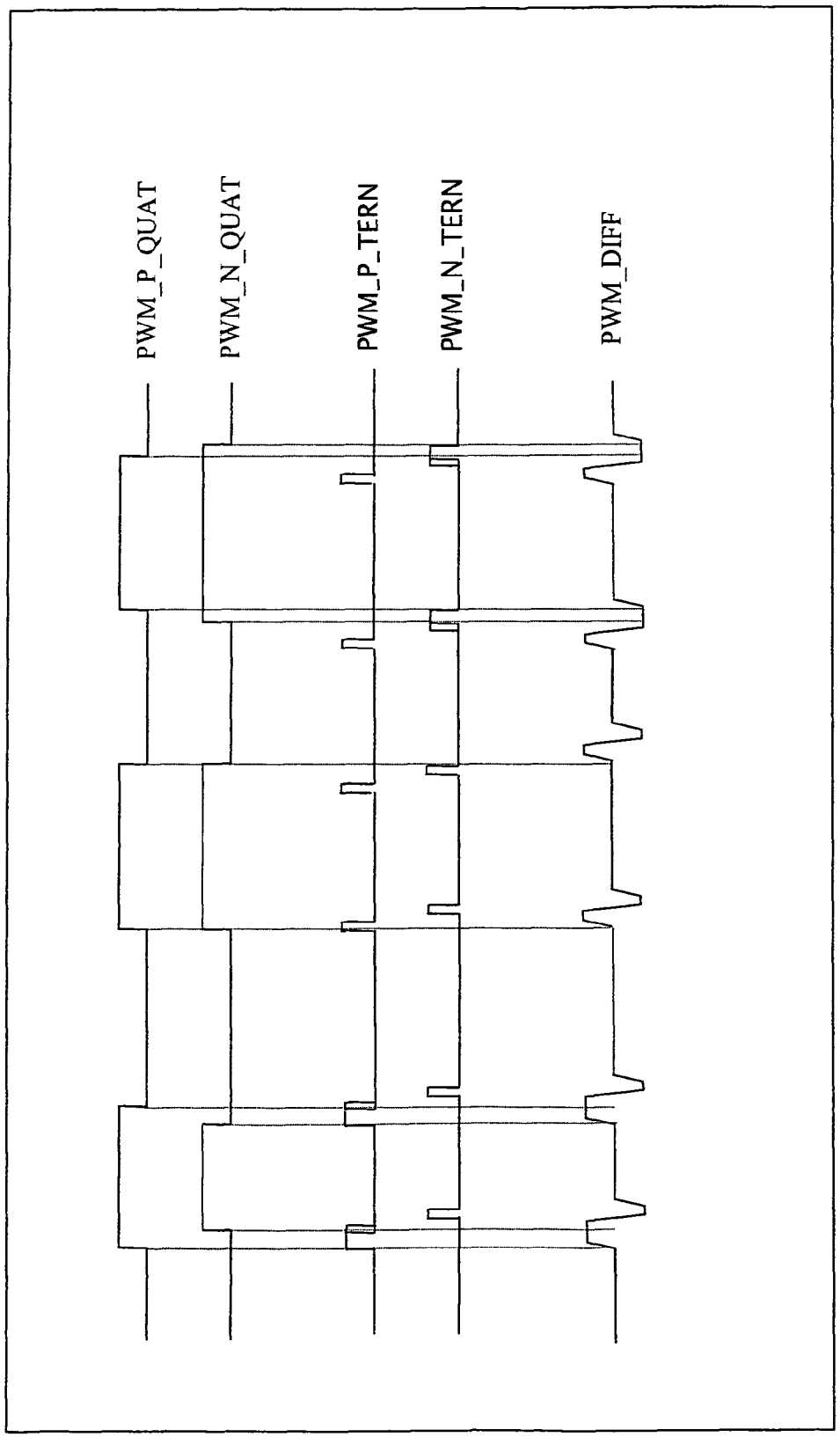
FIG. 3b is a schematic illustration of quaternary output waveforms, ternary output waveforms and the differential output waveform of the Class-D amplifier of FIG. 1a when a second compensating method according to the prior art is used.
Figure 4:
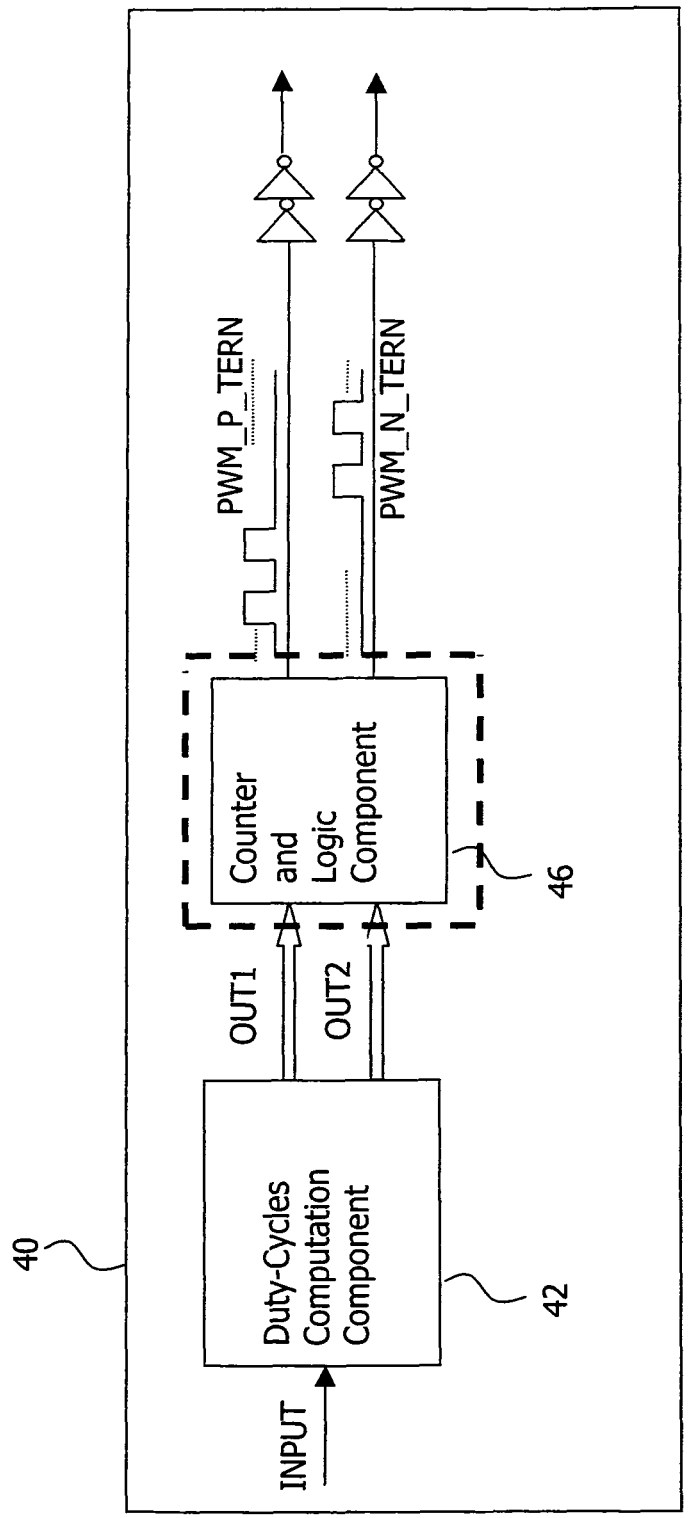
FIG. 4 is a schematic illustration of a block diagram of a digital Class-D amplifier.

A schematic illustration of a block diagram of a digital Class-D amplifier 40 is given in FIG. 4. As shown in FIG. 4, the digital Class-D amplifier like usual digital Class-D amplifiers is made of two main blocks, the first one being a duty-cycles computation component 42 and the second one being a counter and logic component 46. The duty-cycles computation component 42 is adapted to compute a value of outputs duty cycles OUT1 and OUT2. The computation of the value of the outputs duty cycles OUT1 and OUT2 can be performed as known in the art. For example, as described with respect to FIG. 1a, the input signal INPUT is compared with a reference signal, like a triangular reference signal as shown in FIG. 1a, to generate pulse width modulated (PWM) quaternary output waveforms. From the resulting quaternary PWM output waveforms, the respective duty cycle values can be computed.

The counter and logic component 46 is adapted to generate the ternary PWM output waveforms PWM_P_TERN (resulting from the comparison of the input signal INPUT with positive cycles of the reference signal) and PWM_N_TERN (resulting from the comparison of the input signal INPUT with negative cycles of the reference signal) based on the computed values of the duty cycles. For example, the following two equations are implemented in the counter and logic component 44 to generate the ternary PWM output waveforms PWM_P_TERN and PWM_N_TERN from the quaternary PWM output waveforms:

$$PWM\_P\_TERN = (PWM\_P\_QUAT \text{ and not } PWM\_N\_QUAT) \quad (1)$$

$$PWM\_N\_TERN = (PWM\_N\_QUAT \text{ and not } PWM\_P\_QUAT) \quad (2)$$

Figure 5:
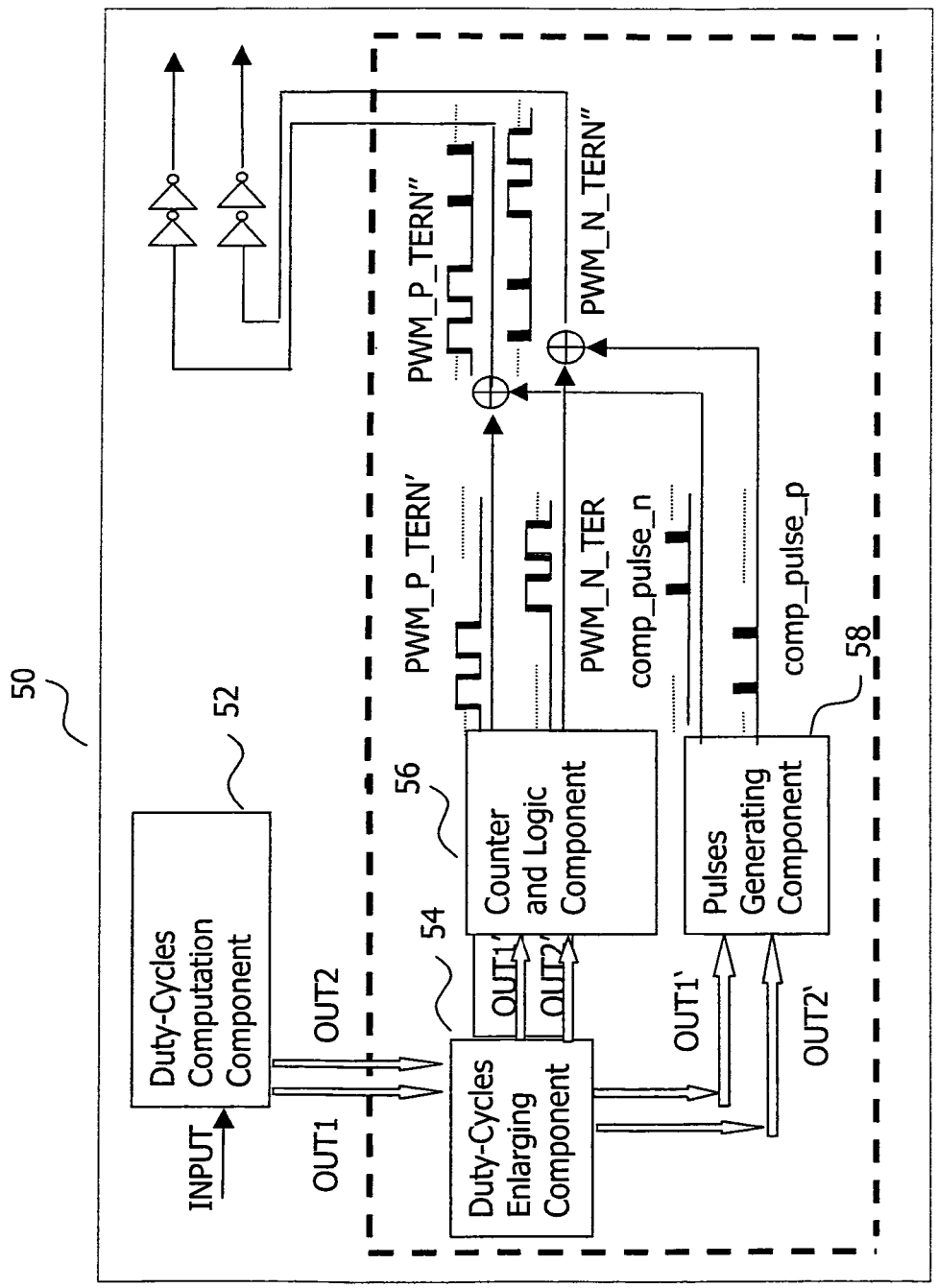
FIG. 5 is a schematic illustration of a block diagram of a digital Class-D amplifier according to an apparatus embodiment.

FIG. 5 shows an apparatus embodiment of the Class-D amplifier 50 which is based on the schematic illustration shown in FIG. 4. According to this apparatus embodiment shown in FIG. 5, the counter and logic component 56 is preceded by a duty-cycles enlarging component 54. The duty-cycles enlarging component 54 is adapted to receive, from the duty-cycles computation component 52, the computed values of duty cycles for the first and second output waveforms OUT1 and OUT2 and is adapted to enlarge the relative difference between the computed duty cycles values OUT1 and OUT2 by a programmable width to generate enlarged values of duty cycles for the first and second output waveforms OUT1' and OUT2'. The programmable width is preferably stored in the duty-cycles enlarging component 54 and can be changed dependent on the respective task.

The generated enlarged values of duty cycles OUT1' and OUT2' are then passed to the counter and logic component 56 and to a compensating pulses generating component 58, which are both coupled to the duty-cycles enlarging component 54.

The counter and logic component 56 may be similar or identical to the counter and logic component 46 described with respect to FIG. 4. For example, in the counter and logic component 56 the equations (1) and (2) may be implemented in order to generate the ternary PWM output signals PWM_P_TERN' and PWM_N_TERN'. It is alternatively also conceivable that the counter and logic component 56 may implement a different logic to determine the ternary PWM output waveforms PWM_P_TERN' and PWM_N_TERN'.

The compensating pulses generating component 58 is adapted to receive the enlarged values of duty cycles OUT1' and OUT2' from the duty cycles enlarging component 54 and to generate first and second compensating pulses comp_pulse_p and comp_pulse_n. The first compensating pulses comp_pulse_p are added to the ternary output waveform PWM_N_TERN' to compensate the enlargement of the pulses of the ternary PWM output waveform PWM_P_TERN' and the second compensating pulses comp_pulse_n are added to the ternary output waveform PWM_P_TERN' to compensate the enlargement of the pulses of the ternary PWM output waveform PWM_N_TERN'.

The compensating pulses generating component 58 adds the first and second compensating pulses comp_pulse_p, comp_pulse_n right in the middle position of the corresponding pulses of the ternary PWM output waveforms PWM_P_TERN' and PWM_N_TERN', which are to be compensated. By adding the first and second compensating pulses comp_pulse_n, comp_pulse_p to the ternary PWM output waveforms PWM_P_TERN' and PWM_N_TERN', ternary PWM output waveforms PWM_P_TERN" and PWM_N_TERN" are generated.

Figure 6:
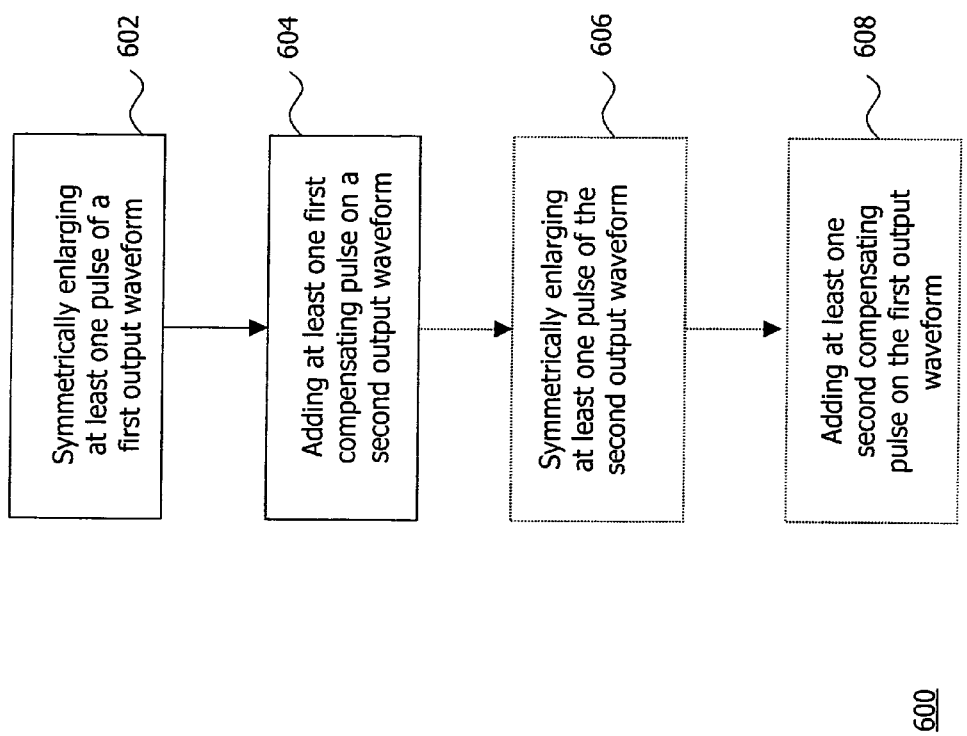
FIG. 6 is a schematic illustration of a first and second method embodiment performed in the digital Class-D amplifier according to the apparatus embodiment of FIG. 5.
Figure 7:
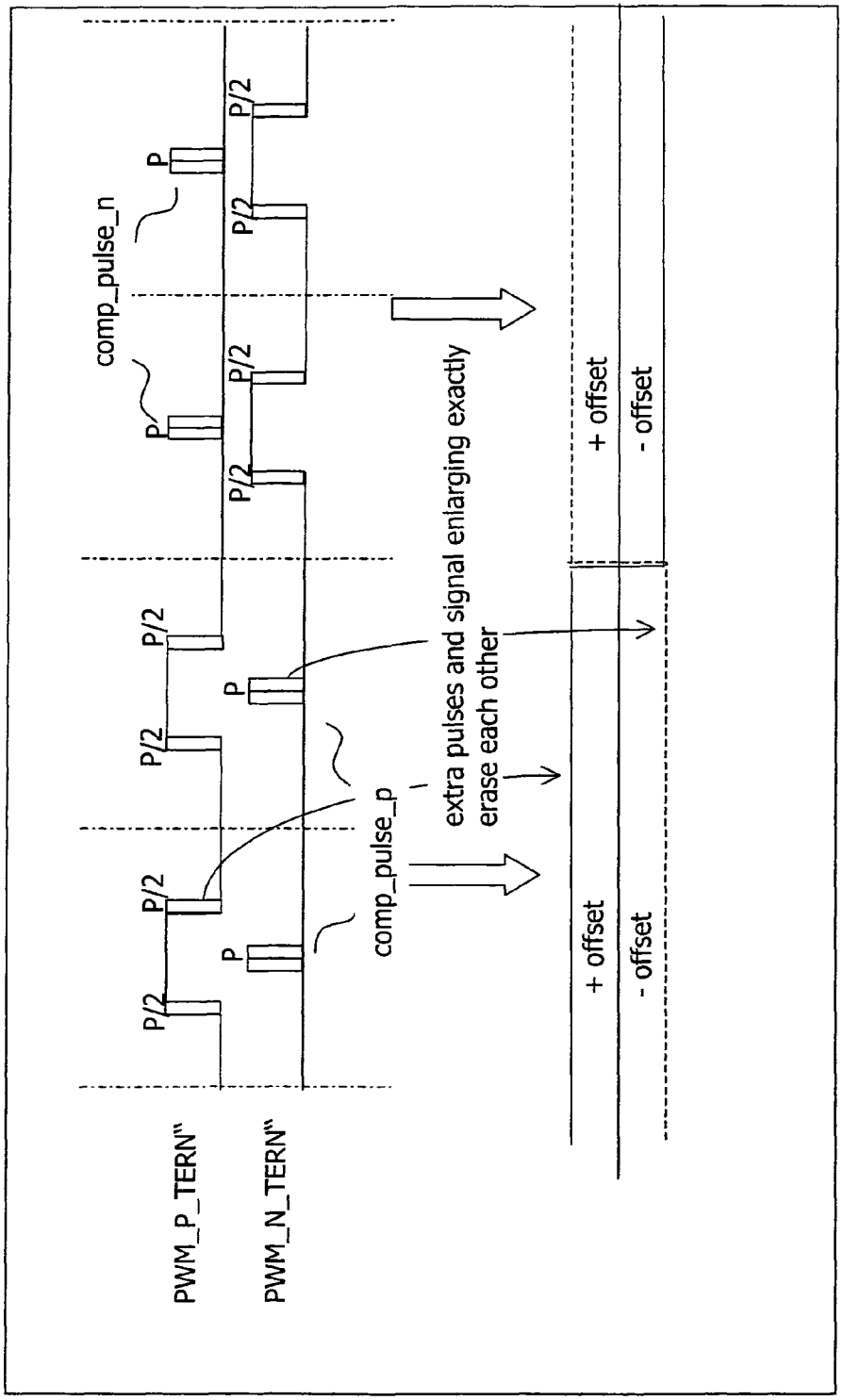
FIG. 7 is a schematic illustration of ternary output waveforms of the digital Class-D amplifier according to the apparatus embodiment of FIG. 5 and the second method embodiment of FIG. 6.

Further details regarding the generation of the ternary PWM output waveforms PWM_P_TERN" and PWM_N_TERN" are described with regard to the first and second method embodiments shown in FIGS. 6 and 7. As exemplarily illustrated in FIG. 5, each of the output waveforms PWM_P_TERN', PWM_N_TERN', PWM_P_TERN" and PWM_N_TERN" comprises two pulses. Likewise, two first compensating pulses comp_pulse_p and two second compensating pulses comp_pulse_n are shown. As indicated by the dotted lines at the waveforms, the output waveforms may comprise more or less than the shown two pulses. Similarly, more or less than two compensating pulses comp_pulse_p and comp_pulse_n may respectively added. For sake of simplicity, it will in the following be referred to two pulses of the output waveforms and two compensating pulses, although more than two or only one pulse and compensating pulse may be used.

FIG. 6 illustrates a flow diagram of a first method embodiment comprising steps 602 and 604. Steps 606 and 608 given in dotted lines are not performed in the first method embodiment.

In step 602, the duty cycles enlarging component 54 and the counter and logic component 56 symmetrically enlarge two pulses of a first output waveform OUT1 to generate a first ternary PWM output waveform PWM_P_TERN' comprising two enlarged pulses. The two pulses of the first output waveform OUT1 are respectively symmetrically enlarged by a first enlarging pulse with respect to the centre position of each of the two pulses. For example, one half of the first enlarging pulse is added to the rising edge and another half of the first enlarging pulse is added to the falling edge of each of the two pulses.

In step 604, which may be performed simultaneously to step 602 or before or after step 602, two first compensating pulses comp_pulse_p are generated by the compensating pulse generating component 58 and are added to a second ternary PWM output waveform PWM_N_TERN' to compensate the enlargement of the two pulses of the first ternary PWM output waveform PWM_P_TERN'. The two first compensating pulses comp_pulse_p have substantially the same width as the first enlarging pulse and are added on the second ternary PWM output waveform PWM_N_TERN' at a position which corresponds to the centre position of the corresponding pulse of the first ternary PWM output waveform PWM_P_TERN', the enlargement of which is intended to be compensated.

The second method embodiment contains steps 602 and 604 of the first method embodiment and additionally contains steps 606 and 608 shown in dotted lines in FIG. 6. The order of steps 602, 604, 606 and 608 is arbitrary. For example, all steps 602 to 608 may be simultaneously performed. Alternatively, the order of the steps can be dependent on the output waveform, i.e. the steps 602 and 608 performed on the first output waveform can be performed first (or second) and the steps 604 and 606 performed on the second output waveform may be performed second (or first). In a further alternative, the order of the steps can be dependent on the task to be performed, i.e. the enlarging steps 602 and 606 can be performed at first (or afterwards) and the adding steps 604 and 608 can be performed afterwards (at first).

Independent of when the respective steps in FIG. 6 are performed, in step 606, two pulses of the second output waveform OUT2 are symmetrically enlarged by the duty-cycles enlarging component 54 and the counter and logic component 56 to generate two enlarged pulses of the second ternary PWM output waveform PWM_N_TERN'. For enlarging the pulses of the second output waveform OUT2, a second enlarging pulse is used such that each pulse of the second output waveform OUT2 is symmetrically enlarged by the second enlarging pulse with respect to the centre position of the respective pulse. For example, one half of the second enlarging pulse is added to the rising edge and another half of the second enlarging pulse is added to the falling edge of each of the two pulses.

In step 608, two second compensating pulses comp_pulse_n are generated and added on the first ternary PWM output waveform PWM_P_TERN' to compensate the enlargement of the two pulses of the second ternary PWM output waveform PWM_N_TERN'. Each of the two second compensating pulses comp_pulse_n has substantially the same width as the enlarging pulse and is added on the first ternary PWM output waveform PWM_P_TERN' at a position which corresponds to the centre position of the corresponding pulse of the second output waveform PWM_N_TERN', which is intended to be compensated by the second compensating pulse comp_pulse_n.

Figure 8:
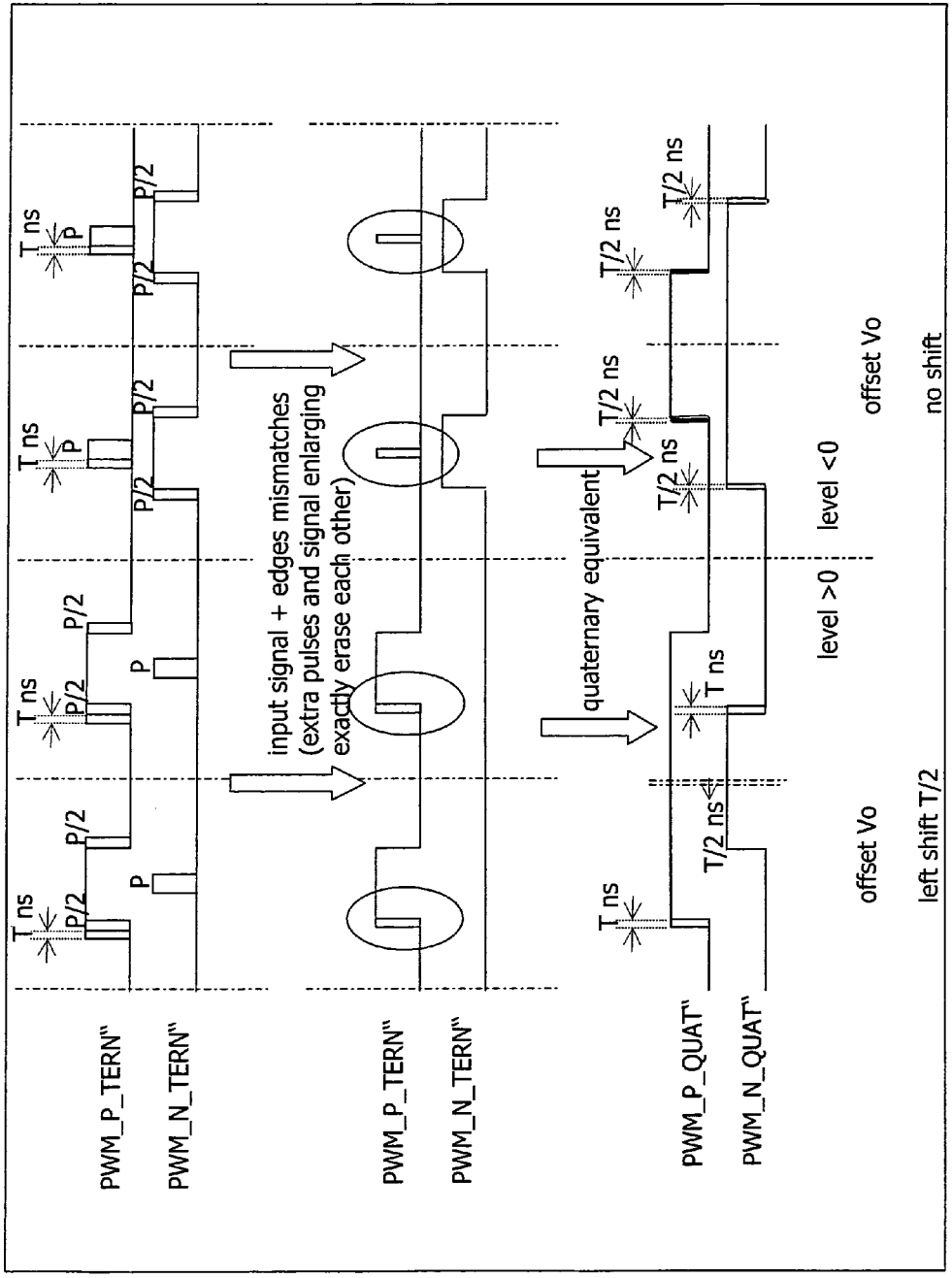
FIG. 8 is a schematic illustration of ternary output waveforms of the digital Class-D amplifier according to the apparatus embodiment of FIG. 5 and the second method embodiment of FIG. 6, and the quaternary equivalents of the ternary output waveforms.

Further details of the apparatus and method embodiments shown in FIGS. 5 and 6 are explained with respect to FIGS. 7 and 8.

FIG. 7 illustrates the effects of the apparatus and method embodiments described above. As described in detail above, FIG. 7 shows the first ternary PWM output waveform PWM_P_TERN" having (exemplarily) two enlarged pulses. The two pulses of the first ternary PWM output waveform PWM_P_TERN" have been enlarged by adding, to each of the two pulses, one half P/2 of an enlarging pulse to the rising edge and another half P/2 of the enlarging pulse to the falling edge. In the same manner, the two pulses of the second ternary PWM output waveform PWM_N_TERN" have been enlarged.

In addition to the enlargement of each of the two pulses of the first ternary PWM output waveform PWM_P_TERN" and the enlargement of each of the two pulses of the second ternary PWM output waveform PWM_N_TERN", the compensating pulses comp_pulse_p and comp_pulse_n are respectively added to the corresponding output waveforms during the inactive outputs phases. As can be seen from FIG. 7, each of the compensating pulses has a pulse width of P. Further, the number of compensating pulses added corresponds to the number of enlarged pulses. As can be also seen in FIG. 7, each compensating pulse is added in the centre position (right in the middle) of the corresponding enlarged pulse of the corresponding output waveform. For example, the first compensating pulse comp_pulse_p added to the second ternary PWM output waveform PWM_N_TERN" to compensate the enlargement of the first pulse of the first ternary PWM output waveform PWM_P_TERN" is added on the second ternary PWM output waveform PWM_N_TERN" in the middle position (in the exact centre) of the first pulse of the first ternary PWM output waveform PWM_P_TERN". Likewise, the first compensating pulse comp_pulse_n added to the first ternary PWM output waveform PWM_P_TERN" to compensate the enlargement of the first pulse of the second ternary PWM output waveform PWM_N_TERN" is added on the first ternary PWM output waveform PWM_P_TERN" in the middle position (in the exact centre) of the first pulse of the second ternary PWM output waveform PWM_N_TERN". The second (and further) compensating pulses are then added to compensate the enlargement of the second (and further) enlarged pulses.

Of course, the number of enlarged pulses and the number of compensating pulses is only exemplarily and any number other than two, e.g. one, three, four or more than four, can be used in the apparatus and method embodiments described above.

Since the width P of the compensating pulses is identical to the enlargement amount of the pulses, the same offset is added to both output waveforms. In this way, the compensating pulses and the enlargement amount of the pulses exactly erase each other.

Central compensating pulses comp_pulse_p are added on the second ternary PWM output waveform PWM_N_TERN" when the positive cycle of the reference signal is used (PWM_P_TERN" is active) and central compensating pulses comp_pulse_n are added on the first ternary PWM output waveform PWM_P_TERN" when the negative cycle of the reference signal is used (PWM_N_TERN" is active), while symmetrically enlarging by the same amount added as the compensating pulses width the respective pulses of the output waveforms PWM_P_TERN" and PWM_N_TERN".

This double operation corresponds to add as an extra/additional signal a small level square-wave, while subtracting the same square-wave from the active signal, as shown in FIG. 7. Due to the position of the added pulses, this approach itself does not introduce any modification of the original signal while adding the extra pulses.

In this way, the problem of the distortion generated in a ternary modulation by edges non idealities is solved, which will be further explained with respect to FIG. 8.

FIG. 8 illustrates an example, in which there exists an edges mismatch such that the rising edge of the pulses of the first ternary PWM output waveform PWM_P_TERN" is T nanoseconds faster than the rising edge of the pulses of the second ternary PWM output waveform PWM_N_TERN".

As can be seen from FIG. 8, for positive cycles of the reference signal (level>0), the compensating pulses comp_pulse_p added to the second ternary PWM output waveform PWM_N_TERN" exactly compensate (erase) the width by which the pulses of the first ternary PWM output waveform PWM_P_TERN" are enlarged. Thus, the resulting pulses of the first ternary PWM output waveform PWM_P_TERN" have the same offset Vo and are shifted to the left by T/2 nanoseconds (half of the time the rising edge of the first ternary PWM output waveform PWM_P_TERN" is faster than the rising edge of the second ternary PWM output waveform PWM_N_TERN"). This can be seen best from the quaternary equivalents of the first and second ternary PWM output waveforms PWM_P_TERN" and PWM_N_TERN", namely the first and second quaternary PWM output waveforms PWM_P_QUAT" and PWM_N_QUAT". From the first and second quaternary PWM output waveforms PWM_P_QUAT" and PWM_N_QUAT" it can be seen that both waveforms are shifted to the left by T/2 and have an offset Vo.

When the negative cycle of the reference signal is used (level<0), the compensating pulses comp_pulse_n added to the first ternary PWM output waveform PWM_P_TERN" exactly compensate (erase) the width by which the pulses of the second ternary PWM output waveform PWM_N_TERN" are enlarged. Since the rising edge of the first ternary PWM output waveform PWM_P_TERN" is faster than the rising edge of the second ternary PWM output waveform PWM_N_TERN", a residual signal remains on the first ternary PWM output waveform PWM_P_TERN" right in the middle position of the pulses of the second ternary PWM output waveform PWM_N_TERN". From the quaternary equivalents, i.e. the first and second quaternary PWM output waveforms PWM_P_QUAT" and PWM_N_QUAT", the following can be derived: both waveforms have an offset of Vo; and on both edges (the rising and falling edge) the same time shift T/2 nanoseconds is present. That is, the rising edge non-ideality adds the same offset Vo, but the two waveforms are not shifted with respect to each other.

As a result, there is the same offset Vo in case of positive cycles and negative cycles of the reference signal. Therefore the distortion due to non-symmetric outputs offset is solved. Further, the relative shift between the positive and negative cycles is reduced to T/2 nanoseconds as compared with a shift of T nanoseconds as obtained with prior art techniques. In this way the final distortion is minimized.

The new ternary PWM modulation scheme proposed herein has the advantages of preserving a good ternary modulation efficiency. This is the big advantage of ternary modulation over quaternary. At the same time the distortion due to the edges mismatch between the output waveforms is significantly reduced and minimized as much as possible.

In this way, the present invention makes a digital Class-D amplifier with ternary modulation more insensible to the environment, e.g. output loads, signal paths on the board and so on.

It is believed that many advantages of the present invention will be fully understood from the foregoing description, and it will be apparent that various changes may be made in the form, construction and arrangement of the exemplary aspects thereof without departing from the scope of the invention or without sacrificing all of its advantages. Because the invention can be varied in many ways, it will be recognized that the invention should be limited only by the scope of the following claims.

The invention claimed is:

1. A method for reducing distortion of output waveforms of a digital class-D amplifier implementing a ternary modulation scheme, the method comprising:
  enlarging at least one pulse of a first output waveform of the amplifier by a first enlarging pulse, wherein the at least one pulse of the first output waveform is symmetrically enlarged by the first enlarging pulse with respect to the center position of the at least one pulse of the first output waveform; and
  adding at least one first compensating pulse to a second output waveform of the amplifier to compensate the enlargement of the at least one pulse of the first output waveform, wherein the at least one first compensating pulse has substantially the same width as the first enlarging pulse and is added to the second output waveform at a position corresponding to the center position of the at least one pulse of the first output waveform.

2. The method of claim 1, wherein the first output waveform includes a first plurality of pulses, wherein each of the first plurality of pulses is enlarged by the first enlarging pulse, and wherein the number of first compensating pulses added to the second output waveform equals the number of the first plurality of pulses.

3. The method of claim 1, further comprising:
  enlarging at least one pulse of the second output waveform by a second enlarging pulse, wherein the at least one pulse of the second output waveform is symmetrically enlarged by the second enlarging pulse with respect to the center position of the at least one pulse of the second output waveform; and
  adding at least one second compensating pulse to the first output waveform to compensate the enlargement of the at least one pulse of the second output waveform, wherein the at least one second compensating pulse has substantially the same width as the second enlarging pulse and is added to the first output waveform at a position which corresponds to the center position of the at least one pulse of the second output waveform.

4. The method of claim 3, wherein the second output waveform includes a second plurality of pulses, wherein each of the second plurality of pulses is enlarged by the second enlarging pulse, and wherein the number of second compensating pulses added to the first output waveform equals the number of the second plurality of pulses.

5. The method of claim 3, wherein the width of the at least one second compensating pulse equals the width of the at least one first compensating pulse.

6. The method of claim 3, further comprising:
  enlarging a relative difference between computed values of duty cycles for the first and second output waveforms by a programmable width to generate enlarged values of duty cycles for the first and second output waveforms;
  wherein enlarging the at least one pulse of the first and second output waveforms comprises enlarging the at least one pulse of at least one of the first output waveform and the second output waveform based on the enlarged values of duty cycles for the first and second output waveforms.

7. The method of claim 3, wherein both of the at least one first compensating pulse and the at least one second compensating pulse comprise a small level square-wave.

8. The method of claim 1, wherein the at least one pulse of the first output waveform is symmetrically enlarged by adding one half of the first enlarging pulse to the rising edge and by adding another half of the first enlarging pulse to the falling edge of the at least one pulse.

9. A digital class-D amplifier implementing a ternary modulation scheme for reducing distortion of output waveforms of the amplifier, the amplifier comprising:
  an enlarging circuit configured to enlarge at least one pulse of a first output waveform of the amplifier by a first enlarging pulse, wherein the at least one pulse of the first output waveform is symmetrically enlarged by the first enlarging pulse with respect to the center position of the at least one pulse; and
  a pulses generating circuit configured to:
    generate at least one first compensating pulse; and
    add the generated at least one first compensating pulse to a second output waveform of the amplifier;
    wherein the at least one first compensating pulse has substantially the same width as the first enlarging pulse and is added to the second output waveform at a position corresponding to the center position of the at least one pulse of the first output waveform.

10. The amplifier of claim 9, wherein:
  the enlarging circuit is further configured to enlarge at least one pulse of the second output waveform of the amplifier by a second enlarging pulse, wherein the at least one pulse of the second output waveform is symmetrically enlarged by the second enlarging pulse with respect to the center position of the at least one pulse of the second output waveform; and
  the pulses generating circuit is further configured to:
    generate at least one second compensating pulse; and
    add the generated at least one second compensating pulse to the first output waveform of the amplifier;
    wherein the at least one second compensating pulse has substantially the same width as the second enlarging pulse and is added to the first output waveform at a position corresponding to the center position of the at least one pulse of the second output waveform.

11. The amplifier of claim 10, wherein the amplifier further comprises:
   a duty-cycles computation circuit configured to compute values of duty cycles for the first and second output waveforms; and
   a duty-cycles enlarging circuit, which is coupled to the output of the duty-cycles computation circuit to receive the computed values of duty cycles for the first and second output waveforms, wherein the duty-cycles enlarging circuit is configured to enlarge the relative difference between the computed values of duty cycles for the first and second output waveforms by a programmable width to generate enlarged values of duty cycles for the first and second output waveforms.

12. The amplifier of claim 11, wherein the amplifier further comprises a counter and logic circuit, which is coupled to the output of the duty-cycles enlarging circuit to receive the enlarged values of duty cycles for the first and second output waveforms from the duty-cycles enlarging circuit, wherein the counter and logic circuit is configured to enlarge the at least one pulse of at least one of the first output waveform and the second output waveform based on the enlarged values of duty cycles for the first and second output waveforms.

13. The amplifier of claim 11, wherein the pulses generating circuit is coupled to the output of the duty-cycles enlarging circuit to receive the enlarged values of duty cycles for the first and second output waveforms, wherein the pulses generating circuit is configured to:
   generate, based on the received enlarged values of duty cycles for the first and second output waveforms, the at least one first compensating pulse and the at least one second compensating pulse;
   add the generated at least one first compensating pulse to the second output waveform at the position corresponding to the center position of the at least one pulse of the first output waveform; and
   add the generated at least one second compensating pulse to the first output waveform at the position corresponding to the center position of the at least one pulse of the second output waveform.

* * * * *